United States Patent [19]
Beelitz et al.

[11] 3,979,607
[45] Sept. 7, 1976

[54] ELECTRICAL CIRCUIT

[75] Inventors: Howard Raymond Beelitz, Princeton; Donald Ray Preslar, Somerville, both of N.J.

[73] Assignee: RCA Corporation, New York, N.Y.

[22] Filed: Oct. 23, 1975

[21] Appl. No.: 625,039

[52] U.S. Cl............................. 307/237; 307/203; 307/214; 307/254; 307/300; 307/DIG. 1
[51] Int. Cl.².................... H03K 5/08; H03K 19/08
[58] Field of Search.......... 307/203, 214, 215, 218, 307/237, 254, 300, DIG. 1

[56] References Cited
UNITED STATES PATENTS

| | | | |
|---|---|---|---|
| 3,381,144 | 4/1968 | Thomas | 307/214 X |
| 3,641,362 | 2/1972 | Gamble | 307/218 X |
| 3,699,355 | 10/1972 | Madrazo et al. | 307/215 |
| 3,867,644 | 2/1975 | Cline | 307/215 X |

*Primary Examiner*—John Zazworsky
*Attorney, Agent, or Firm*—H. Christoffersen; Henry Schanzer

[57] ABSTRACT

A network for preventing large transient currents in the conduction paths of a pull-up transistor connected between a first point of operating potential and an output point and a pull-down transistor connected between the output point and a second point of operating potential. The network includes a third transistor having its base to emitter path connected in parallel with the base to emitter path of the pull-down transistor and its collector coupled to the base of the pull-up transistor. The collector current of the third transistor is limited, causing it to saturate at a given current level and to then limit the flow of additional base drive to the pull-down transistor, whereby the maximum collector current of the pull-down transistor is also limited. In addition, a diode is connected between the output point and the collector of the third transistor. The diode, when conducting, ensures the cut off of the pull-up transistor and provides a current path enabling the third transistor to carry some of the output current, whereby both the pull-down and third transistors clamp the output point to said second point of potential.

9 Claims, 1 Drawing Figure

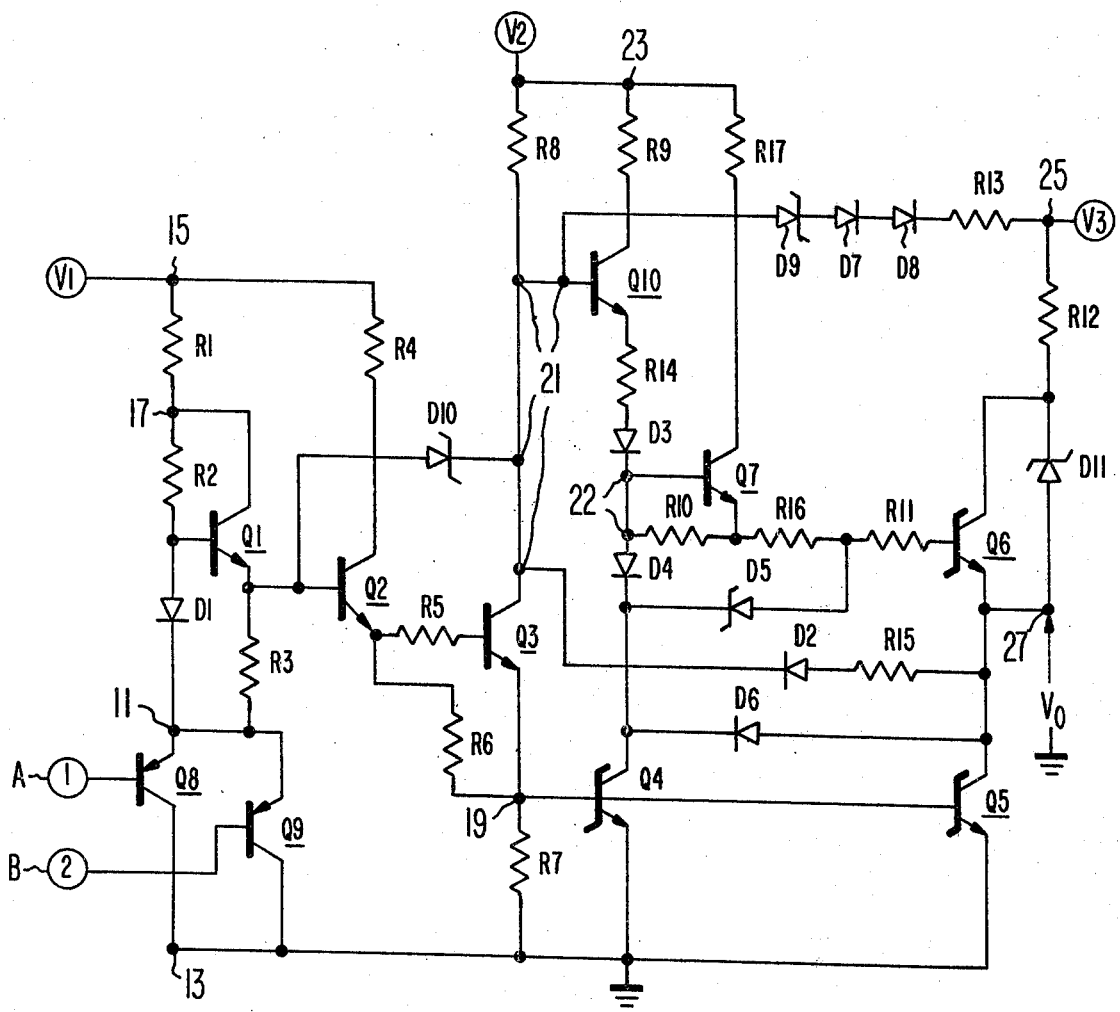

ELECTRICAL CIRCUIT

This invention relates to electrical circuits and in particular to switching circuits which include means for limiting excessive transient or spike-through currents in the output stage of the circuit.

In order to achieve fast rise and fall times while driving capacitive loads (which may be in the order of hundreds of picofarads) it is necessary for the output stage of a circuit to have active pull-up and pull-down circuitry. Thus, the output stage may include a first transistor operated as an emitter follower to clamp the circuit output to a first point of operating potential and a second transistor operated in the common emitter mode to clamp the output to a second point of potential. To ensure good clamping action there should be very little, if any, resistance in series with the conduction paths of the first and second transistors to limit the current. However, under many operating conditions the two transistors may conduct at the same time. This may occur when one of the two transistors is being turned on and the other is being turned off, or when the input signal has a value causing both transistors to be on. When the two transistors are on at the same time, large currents referred to herein as "spike-through" or "transient currents" flow between the first and the second points of potential through the series connected conduction paths of the two transistors. These currents are limited, substantially, only by the current gains of the transistors and the total path resistance. The power dissipation ratings of the transistors may be exceeded and the transistors destroyed. Also, excessive power demands are placed on the power supply connected to the points of potential.

Circuits embodying the invention include first and second transistors hving their conduction paths connected in series between two points of operating potential and where the junction of these two transistors is connected to the output of the circuit. A third transistor is connected at its base and emitter to the base and emitter, respectively, of the first transistor and is coupled at its collector to the base of the second transistor. The collector of the third transistor is returned to a point of operating potential via a current limiting impedance means whereby the third transistor saturates and then limits the flow of additional base drive to the first transistor. In addition, a unidirectional element is connected between the circuit output and the collector of the third transistor. The unidirectional element, when conducting, ensures the cut off of the second transistor and provides an additional load current carrying path through the third transistor in parallel with the path through the first transistor.

The sole FIGURE of the drawing is a schematic diagram of a level shift circuit embodying the invention.

The circuit of the FIGURE includes PNP transistors Q8 and Q9 having their emitter to collector paths connected in parallel between node 11 and terminal 13 to which is applied ground potential. The bases of transistors Q8 and Q9 are connected to input terminals 1 and 2, respectively, to which are applied inputs A and B, respectively.

The cathode of a diode D1 is connected to node 11 and a resistor R3 is connected between the emitter of a transistor Q1 and node 11. One end of a resistor R2 is connected to the base of transistor Q1 and to the anode of a diode D1. The other end of resistor R2, one end of a resistor R1 and the collector of transistor Q1 are connected to node 17. The other end of resistor R1 is connected to terminal 15 to which is applied $V_1$ volts.

A transistor Q1 is connected at its base to the emitter of transister Q1, and at its collector via resistor R4 to terminal 15. Its emitter is connected via a resistor R5 to the base of a phase splitting transistor Q3, and via a resistor R6 to node 19. A diode D10 is connected at its anode to the base of transistor Q2 and at its cathode to node 21. The collector of transistor Q3, the cathode of a diode D2, the base of a transistor Q10, and one end of resistor R8 are also connected to node 21. The emitter of transistor Q3, one end of a resistor R7, and the bases of transistors Q4 and Q5 are connected to node 19. The other end of resistor R7 and the emitters of transistors Q4 and Q5 are connected to terminal 13.

Transistor Q10 is connected at its collector to one end of resistor R9, and at its emitter to one end of resistor R14. The other end of resistor R14 is connected to the anode of a diode D3. The cathode of diode D3, the base of a transistor Q7, one end of resistor R10, and the anode of a diode D4 are connected to node 22. The collector of transistor Q7 is connected to one end of resistor R17. The other ends of resistors R8, R9 and R17 are connected to terminal 23, to which is applied $V_2$ volts. The emitter of transistor Q7 is connected to the other end of resistor R10 and to one end of resistor R16. The other end of resistor R16 is connected to one end of a resistor R11 and to the anode of a diode D5. The cathodes of diodes D4, D5 and D6 are connected to the collector of transistor Q4. The other end of resistor R11 is connected to the base of transistor Q6. The collector of transistor Q6 is connected via resistor R12 to terminal 25 to which is applied $V_3$ volts. The emitter of transistor Q6 and the collector of transistor Q5 are connected to output terminal 27. Resistor R15 is connected between output terminal 27 and the anode of diode D2.

Diodes D9, D7 and D8 are connected in series with resistor R13 between node 21 and terminal 25 and function to limit the base voltage of transistor Q10 to three diode drops above the potential at terminal 25. A diode D11 is connected at its anode to the emitter of transistor 26 and at its cathode to the collector of transistor Q6 to shunt overshoots present at the output 27.

Resistors R11, R12, R13, R14, R15 and R17 are parasitic resistors. They are unnecessary to the operation of the circuit and may be eliminated in circuits using discrete components. In integrated circuits embodying the invention these resistors are diffused regions used, instead of metal connections, to interconnect various points of the circuit and these resistors represent the resistances of the diffused regions.

The use of resistor R16 is optional. It may be inserted in the circuit to control (e.g. slow down) the rise time of the circuit. In the discussion to follow, it will be assumed that resistor R16 is shorted out of the circuit.

Diodes D5, D9, D10 and D11 are Schottky-barrier diodes (SBD). The remaining diodes are conventional junction diodes. Transistors Q4, Q5 and Q6 are NPN Schottky clamped transistors and each is illustrated by a symbol used for an NPN transistor having an SBD connected between its base and collector. Transistors Q1 through Q3, Q7 and Q10 are conventional NPN transistors.

Transistors operated between the cut off and saturation regions are relatively slow due to the turn on delay and to the accumulation of minority carriers during the saturated state of the transistor. A transistor may be kept out of saturation by the connection of a clamping diode between its base and collector regions. In high speed circuits, the clamping diode is preferably an SBD since it has a lower forward voltage drop than conventional silicon PN junction diodes and since it does not store minority carriers. In the discussion to follow, the forward voltage drop of an SBD will be identified as $V_{FS}$ and that of a conventional diode as $V_F$. It will be assumed, for ease of description, that $V_{FS}$ is one half $V_F$ and that the forward base-to-emitter ($V_{BE}$) voltage drop of a transistor is equal to $V_F$ and approximately equal to 0.8 volt. When a Schottky clamped transistor is turned on, any excessive base drive is diverted through the SBD (since it's $V_{FS}$ is lower than the base-to-collector junction diode drop of the transistor). The minimum collector-to-emitter voltage of a Schottky clamped transistor is then approximately equal to $V_{FS}$.

$V_1$, $V_2$ and $V_3$ are different positive operating potentials with $V_1$, $V_2$ and $V_3$ being, for example, +5 volts, +22 volts and +19 volts, respectively. However, $V_2$ and $V_3$ could be the same potentials. The input section operated between $V_1$ volts and ground is compatible with standard digital circuits, such as transistor-transistor-logic (TTL). TTL circuits are, typically, operated between $V_1$ volts and ground and produce output signals (not shown), varying between ground and $V_1$ volts, of the type applied to terminals 1 and 2.

For ease of the description of the operation to follow, the voltage at the base, collector and emitter of a transistor may be identified by the letter V followed by the letter B, C or E, respectively, followed by the reference character of the transistor. Also, the voltage at a node or terminal may be identified by the letter V followed by the number of a node or terminal.

Prior to discussing the spike through problem in detail the static operation of the circuit will be discussed for the condition when one or both of the input signals A and B are low (ground potential) and for the condition when both A and B are high (+$V_1$ volts).

With A or B at, or close to, zero volts, transistor Q8 or Q9 conducts in the emitter follower mode causing the potential at node 11 to be at or close to one $V_{BE}$ drop above ground potential. The collector-to-emitter currents of transistors Q8 and Q9 are derived from terminal 15 via resistors R1 and R2 and the combination of diode D1 in parallel with the base-to-emitter of transistor Q1 in series with resistor R3. Resistor R3 limits the current through the base-to-emitter of transistor Q1. Therefore, substantially all the current flowing through resistors R1 and R2 flows through diode D1 into node 11. There is, substantially, no current at the emitter of transistor Q1 and hence substantially no base drive into transistor Q2, which is either turned off or very slightly on. $V_{BQ1}$ is approximately at ($V_{BE}+V_F$) volts, $V_{EQ1}$ and $V_{BQ2}$ are approximately equal to $V_{BE}$ volts plus any (extremely small) voltage drop across resistor R3, and $V_{EQ2}$ is close to zero volts. $V_{EQ2}$ is applied via resistor R5 to the base of transistor Q3 and via resistor R6 to node 19. since $V_{EQ2}$ is close to zero volts, transistors Q3, Q4 and Q5 are turned off.

Since transistor Q3 is cut off, it draws no collector current. As a result, transistor Q10 is turned on by base current supplied from $V_2$ through resistor R8. Transistor Q10 produces an amplified current at its emitter which flows through resistor R14 and diode D3 into node 22. The base-to-emitter region of the transistor Q7 and resistor R10 provide parallel conduction paths for passing the emitter current of transistor Q10 via resistors R11 and R16 into the base of pull-up transistor Q6. Transistor Q6 is turned on and functions as an emitter follower. It supplies current which charges the output 27 to an output potential ($V_o$) which is nearly equal to $V_3$ present at terminal 25, for the following reasons.

The output load connected between output 27 and ground is assumed to be primarily capacitive, but the output load could be any other type of impedance element or utilization device. Once the output is fully charged, only a sustaining current is required into the base of transistor Q6. The emitter current out of transistor Q10 then flows, primarily, through resistor R10 into the base of transistor Q6.

Diodes D7, D8 and D9 clamp $V_{BQ10}$ to $2V_F+V_{FS}$ volts above the potential at terminal 25. This enables the connection of two independent, and different, sources of potential to terminals 23 and 25. Without this clamping network, the base of transistor Q6 would be overdriven whenever $V_2$ exceeds $V_3$ by more than $[2V_F + V_{FS}]$ volts. With the clamping network, $V_{BQ10}$ is then equal to $[V_3 + 2V_F + V_{FS}]$ volts.

$V_{BQ6}$ thus, is equal to $V_{BQ10}$ minus the forward drops of transistor Q10 and diode D3 and the voltage drop across resistor R10 (usually very small). Since transistor Q6 is a Schottky clamped transistor, the output voltage will be held very close to $[V_3 - V_{FS}]$ volts.

When A and B are at or close to $V_1$ volts, transistors Q8 and Q9 are cut off. Current flows through resistors R1 and R2 and into the base of transistor Q1 turning it on. The emitter current of transistor Q1 then flows into the base of transistor Q2. Transistor Q2 conducts and its emitter current is supplied to the base of transistor Q3 and through resistor R6 into node 19. Resistors R6 and R7 form a voltage divider network with the ohmic value of resistor R7 selected to be somewhat less than that of resistor R6. For Q3 to conduct there must be a $V_{BE}$ drop across resistor R6. The current through R6 also flows through R7. Making R7 less than R6 ensures that transistor Q3 is turned on, before $V_{19}$ is equal to $V_{BE}$ and before transistors Q4 and Q5 can turn on.

In the absence of voltage divider network R6, R7, (i.e. if resistor R6 had been returned to terminal 13 instead of node 19) transistor Q3 would turn on when the minimum input signals at terminals 1 and 2 were approximately 0.8 volt, and transistors Q4 and Q5 would turn on when the minimum input signals were approximately 1.6 volts. The voltage divider network (R6, R7) allows Q3 to turn on only when the input signals are close to 1.6 volts. The noise immunity of the circuit is thus improved by raising the input signal voltage level for which transistor Q3 turns on and the switching transition from one state to the other is sharpened.

When transistor Q3 turns on, $V_{21}$ drops from $[V_{21} + 2V_F + V_{FS}]$ volts to a minimum of $V_F$ volts below $V_o$. If $V_{21}$ attempts to drop by more than $V_F$ volts below $V_o$, diode D2 turns on, drawing current from the output 27 and clamping $V_{21}$ to one $V_F$ drop below $V_o$. The emitter current of transistor Q3 flows into node 19 and when $V_{19}$ rises to $V_{BE}$ volts, transistors Q4 and Q5 are turned on. Sufficient current is supplied to the bases of transistors Q4 and Q5 to cause them to go as deep into saturation as their Schottky clamps permit. The collector voltages of transistors Q4 and Q5 are then close to $V_{BE}$ minus $V_{FS}$, which is approximately equal to 0.4 volt. With $V_{CQ4}$ and $V_{CQ5}$ at 0.4 volt, transistors Q6 and Q7 are turned off.

For $V_{CQ4}$ equal to 0.4 volts, Schottky diode D5 functions to ensure that transistor Q6 is off when the output voltage ($V_O$) is low. The low level of $V_O$ is equal to $V_{FS}$ and $V_{CQ4}$ is likewise equal to $V_{FS}$ volts. With diode D5 in the circuit $V_{BQ6}$ is at most equal to $2V_{FS}$ which is the sum of the $V_{FS}$ of diode D5 and the $V_{FS}$ of transistor Q4. $V_{EQ6}$ is equal to $V_O$ which is equal to $V_{FS}$. Therefore, the potential applied between the base and emitter of transistor Q6 is $V_{FS}$ volts which is below the level necessary to turn on transistor Q6. At the same time, $V_{22}$ is at most equal to $V_{FS} + V_F$ and $V_{BQ6}$ is at most equal to $2V_{FS}$. Therefore, the potential ($V_{FS}$) applied between the base and emitter of transistor Q7 is insufficient to turn it on. Hence, transistors Q6 and Q7 are off and $V_O$ is at, or close to, ground potential.

Diodes D3 and D4 ensure that transistor Q10 is non-conducting in the static condition when the output is low. For this condition, transistors Q1, Q2, Q3, Q4 and Q5 are conducting, sufficient base drive being provided for transistors Q3, Q4 and Q5 to go into clamps. The potential at the collector of transistor Q4 is $V_{FS}$ volts, and with diodes D3 and D4 in the circuit $V_{BQ10}$ must exceed $3V_{BE} + V_{FS}$ volts for transistor Q10 to conduct. The potential at the base of transistor Q2 is $3V_{BE}$ volts (2.4 volts). Since transistor Q3 is on very hard it causes diode D10 to conduct, clamping $V_{BQ10}$ to $3V_{BE} - V_{FS}$ volts. Consequently, transistor Q10 cannot conduct due to insufficient voltages at its base. Diode D10 is preferably a Schottky diode because of its high breakdown voltage and low charge storage characteristic.

The operation of the circuit when the output undergoes a transition from high to low or from low to high or when the output is midway between the high and low levels may now be examined.

Assume that a small capacitive load is connected to output 27 and that both input signals go high ($+V_1$ volts) and cause the output to go from a high ($+V_3$) condition to a low (ground) condition. For the condition of light loads, transistor Q5 can saturate and discharge the output 27 to a low (approximately ground) value of potential while transistor Q4 is still in the active region. For this condition, diode D6 is reversed bias and does not conduct. Transistor Q6 is forward biased since its emitter voltage is being pulled down faster than its base voltage. Transistor Q6 then functions like a low impedance element and supplies a large current from terminal 25 to terminal 27 which can then flow through the conduction path of transistor Q5 to ground. However, excessive currents cannot flow through transistor Q5 because of its relationship with transistor Q4.

Transistors Q4 and Q5 have their base-to-emitter regions connected in parallel, have equal base-to-emitter voltages, and function somewhat like current mirrors. The ratio of the emitter current of transistor Q4 to that of transistor Q5 is equal to a constant which is a function of the ratio of the sizes of the base-to-emitter regions of these two transistors. (The sizes of the base-to-emitter regions may be varied over a wide range and hence the constant may be correspondingly varied over a wide range). For ease of discussion, assume that their base-to-emitter regions are of equal size and that their emitter currents must be nearly equal. When transistors Q4 and Q5 are operated in the linear range, the current supplied to their bases divides equally and they carry equal collector currents. These currents discharge the capacitance at their collector nodes. Therefore, when the capacitance connected to the collector of transistor Q4 is greater than that of transistor Q5, the voltage at the latter will drop faster, and vice-versa when the capacitance at the collector of Q5 is greater than that at the collector of Q4. When one of these two transistors "saturates", it "hogs" more of the base current to maintain the equality of their emitter currents.

When diode D6 is nonconducting the collector current of transistor Q4 is derived from terminal 23 via the network comprised of base bias resistor R8, collector resistor R9, the collector to emitter path of transistor Q10, resistor R14 and diodes D3 and D4. When transistor Q4 can conduct more collector current that transistor Q10 can pass, the latter saturates and its collector-to-emitter voltage becomes very small (0.1 to 0.3 volt). Diodes D3 and D4 and the $V_{BE}$ of transistor Q10 have fixed forward drops and resistor R14 may be neglected since typically, it only has a value of 50 ohms compared to 4.8 K ohms and 1 K ohm for resistors R8 and R9, respectively. Resistors R8 and R9 thus limit the maximum emitter current of transistor Q10 and hence the maximum collector current of transistor Q4. When transistors Q5 and Q6 are on, a large current can flow in the emitter of transistor Q5. Transistor Q4 whose collector current is limited, saturates and "hogs" a greater portion of the base drive current supplied by transistor Q3 to equalize the emitter currents of Q4 and Q5. This thereby limits the base drive into transistor Q5. Since the maximum collector current of a transistor is equal to the forward current gain (B) times its base current, the collector current drawn by transistor Q5 is limited. To a rough approximation the collector current of transistor Q4 is limited to the $V_2$ potential divided by the parallel combination of the resistances of R8 and R9, and the spike through current through Q5 is limited to approximately that same current level. Limiting the current through transistor Q5 prevents its conduction of excessive currents supplied by transistor Q6 or due to any other condition when diode D6 is non-conducting.

Another feature of the invention is the cut off of transistor Q6 when diode D6 conducts. Assume, for example, that the load connected to the output is a large capacitance charged to $V_3$ volts, and that both of the input signals go from low to high. For this condition $V_{CQ4}$ will drop much faster than $V_O$. When $V_O$ is more positive than $V_{CQ4}$ by $V_F$ volts, diode D6 conducts current from the output into the collector of transistor Q4. Transistor Q4 then conducts part of the output load current and aids Q5 in quickly discharging the output. When diode D6 conducts, $V_{CQ4}$ is one $V_F$ drop below $V_O$. Since transistor Q4 is conducting, $V_{22}$ is at most one $V_F$ drop above $V_{CQ4}$. Thus, $V_{22}$ is substantially equal to $V_O$. Therefore, the potential applied between the base and emitter of transistor Q6 is approximately equal to zero volts and the transistor is non-conducting. Clearly the turn on of diode D6 maintains transistor Q6 in the off condition, thereby breaking any possible connection between terminals 25 and 13 through the series connection of transistors Q5 and Q6. Spike through current limiting in the output stage is achieved without the use of resistors or other current limiting elements connected in series with the conduction paths of the output stage transistors. Resistor R12 connected between the collector of transistor Q6 and terminal 25 may be eliminated from the circuit and is not relied upon to limit excessive current transients. The output sourcing (pull-up) and sinking (pull-down) capability of the circuit is not limited by the protection circuit, and in the absence of limiting resistors the output load can be charged or discharged quickly. The circuit output is suited to drive metal-oxide semiconductor (MOS) devices and memories. The circuit provides a voltage level shift from standard TTL voltage levels ($V_1$) to higher voltage levels ($V_2$ or $V_3$) and develops considerable current gain to drive high capacitive loads.

What is claimed is:

1. The combination comprising:
   an output point and first and second points of operating potential;
   a first transistor connected at its collector to said output point and at its emitter to said first point;
   a second transistor having its collector-to-emitter path connected between said output point and said second point;
   a third transistor connected at its base and emitter, by negligible impedance means to the base and emitter, respectively, of said first transistor; and means coupling the collector of said third transistor to the base of said second transistor;
   means for supplying a turn on current to the bases of said first and third transistors;
   collector current limiting impedance means connected between the collector of said third transistor and a point of fixed potential; and
   a unidirectional conducting means connected between said output point and the collector of said third transistor poled to enable the third transistor to conduct current between said output point and said first point in the same direction as said first transistor, and said unidirectional conducting means, when conducting a current, turning off said second transistor.

2. The combination as claimed in claim 1 wherein said second transistor is connected at its collector to said second point and at its emitter to said output point; and
   wherein said first, second and third transistors are of the same conductivity type.

3. The combination as claimed in claim 2 wherein said unidirectional conductions means is a diode; and
   wherein said means coupling the collector of said third transistor to the base of said second transistor includes another diode.

4. The combination as claimed in claim 3, wherein said current limiting impedance means includes a fourth transistor; means connecting the emitter of said fourth transistor to the collector of said third transistor and to the base of said second transistor; and
   a resistor connected between the collector of said fourth transistor and said point of fixed potential.

5. The combination as claimed in claim 4 wherein said turn on current supplying means includes a fifth, phase splitting, transistor connected at its collector to the base of said fourth transistor and at its emitter to the bases of said first and third transistors; and
   impedance means connected at one end to said point of fixed potential and at the other end to the base of said fourth transistor and to the collector of said fifth transistor.

6. The combination as claimed in claim 5 further including means connected between the base of said fourth transistor and said second point of potential for maintaining a given potential differential between said base of said fourth transistor and said second point of potential.

7. The combination as claimed in claim 6 wherein said means connected between the base of said fourth transistor and said second point includes unidirectionally conductive elements for generating a voltage drop between said base of said fourth transistor and said second point approximately equal to the voltage drop between the base of said fourth transistor and said output point.

8. The combination as claimed in claim 5 wherein said first and third transistors are Schottky clamped transistors.

9. The combination as claimed in claim 5 further including:
   an input point;
   means for applying an input signal to said input point;
   input signal responsive means connected between said input point and the base of said fifth transistor for selectively supplying a turn on signal to said fifth transistor; and
   a resistive divider network comprised of at least two resistors, one of said resistor being connected between the base and emitter of said fifth transistor and the other one of said two resistors being connected between the emitter of said fifth transistor and said first point.

* * * * *

UNITED STATES PATENT OFFICE
CERTIFICATE OF CORRECTION

PATENT NO. : 3,979,607
DATED : September 7, 1976
INVENTOR(S) : Howard Raymond Beelitz et al It is certified that error appears in the above-identified patent and that said Letters Patent are hereby corrected as shown below:

Col. 1 line 37 change hving to --- having ---.

Col. 2 line 4 change Q1 to --- Q2 ---.

Col. 3 line 60 change since to --- Since ---.

Col. 4 line 57 change $[V_{21} + 2V_F + V_{FS}]$ to --- $[V_3 + 2V_F + V_{FS}]$ ---.

Col. 6 line 14 change that to --- than ---.

Signed and Sealed this

First Day of February 1977

[SEAL]

Attest:

RUTH C. MASON
*Attesting Officer*

C. MARSHALL DANN
*Commissioner of Patents and Trademarks*